(12) United States Patent
Kim et al.

(10) Patent No.: US 12,347,475 B2
(45) Date of Patent: Jul. 1, 2025

(54) MEMORY DEVICE AND METHOD OF OPERATING A VOLTAGE-CONTROLLED MAGNETIC ANISOTROPY (VCMA) MAGNETIC TUNNEL JUNCTION (MTJ) DEVICE

(71) Applicants: IMEC vzw, Leuven (BE); Katholieke Universiteit Leuven, Leuven (BE)

(72) Inventors: Woojin Kim, Watermael-Boitsfort (BE); Yueh Chang Wu, Heverlee (BE); Stefan Cosemans, Leuven (BE); Gouri Sankar Kar, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 17/344,796

(22) Filed: Jun. 10, 2021

(65) Prior Publication Data

US 2021/0390997 A1    Dec. 16, 2021

(30) Foreign Application Priority Data

Jun. 12, 2020  (EP) ..................... 20179677

(51) Int. Cl.
*G11C 11/16* (2006.01)
*G11C 5/14* (2006.01)

(52) U.S. Cl.
CPC .......... *G11C 11/1697* (2013.01); *G11C 5/147* (2013.01); *G11C 11/1673* (2013.01); *G11C 11/1675* (2013.01)

(58) Field of Classification Search
None
See application file for complete search history.

(56) References Cited

U.S. PATENT DOCUMENTS 8,988,923 B2      3/2015  Khalili Amiri et al.
2013/0343117 A1*  12/2013 Lua ..................... G11C 11/1675
                                                      365/158
2014/0070344 A1*  3/2014  Khalili Amiri ....... H01L 27/226
                                                      257/421

(Continued)

OTHER PUBLICATIONS

Khalili Amiri et al., Electric-Field-Controlled Magnetoelectric RAM: Progress, Challenges, and Scaling, IEEE Transactions on Magnetics, vol. 51, No. 11, Nov. 2015.

(Continued)

*Primary Examiner* — Douglas King
(74) *Attorney, Agent, or Firm* — Knobbe, Martens, Olson & Bear LLP

(57) ABSTRACT

A method of operating a voltage-controlled magnetic anisotropy (VCMA) magnetic tunnel junction (MTJ) device is disclosed. The MTJ device is switchable between a first resistance state and a second resistance state. A first threshold voltage for switching the MTJ device from the second resistance state to the first resistance state is lower than a second threshold voltage for switching the MTJ device from the first resistance state to the second resistance state. The method includes applying a first voltage pulse across the MTJ device with an amplitude having an absolute value equal to or greater than the first threshold voltage and lower than the second threshold voltage, thereby setting the MTJ device to the first resistance state regardless of whether the MTJ device initially is in the first or second resistance state.

23 Claims, 11 Drawing Sheets

(56) References Cited

U.S. PATENT DOCUMENTS

| | | | |
|---|---|---|---|
| 2014/0071732 A1* | 3/2014 | Khalili Amiri | G11C 11/1675 |
| | | | 365/145 |
| 2014/0177327 A1 | 6/2014 | Khalili Amiri et al. | |
| 2015/0262640 A1* | 9/2015 | Katayama | G11C 11/1675 |
| | | | 365/158 |
| 2016/0055894 A1* | 2/2016 | Houssameddine | G11C 29/838 |
| | | | 365/158 |
| 2016/0099035 A1 | 4/2016 | Khalili Amiri et al. | |
| 2016/0197263 A1 | 7/2016 | Hu | |
| 2016/0300604 A1* | 10/2016 | Lee | H10B 61/22 |
| 2017/0033281 A1 | 2/2017 | Hu | |
| 2017/0372761 A1 | 12/2017 | Lee | |
| 2018/0091300 A1* | 3/2018 | Tomishima | G11C 11/161 |
| 2018/0158499 A1* | 6/2018 | Shimomura | G11C 11/1675 |
| 2019/0115060 A1* | 4/2019 | Deshpande | G11C 11/1673 |

OTHER PUBLICATIONS

Kanai et al., Magnetization Switching in a CoFeB/MgO Magnetic Tunnel Junction by Combining Spin-transfer Torque and Electric Field-Effect, Applied Physics Letters 104, 212406, May 2014.
Extended European Search Report, dated Dec. 2, 2020, in EP Application No. 20179677.8.
Ikeura et al., Reduction in the Write Error Rate of Voltage-Induced Dynamic Magnetization Switching Using the Reverse Bias Method, Japanese Journal of Applied Physics, 57, 040311, Mar. 2018.

* cited by examiner

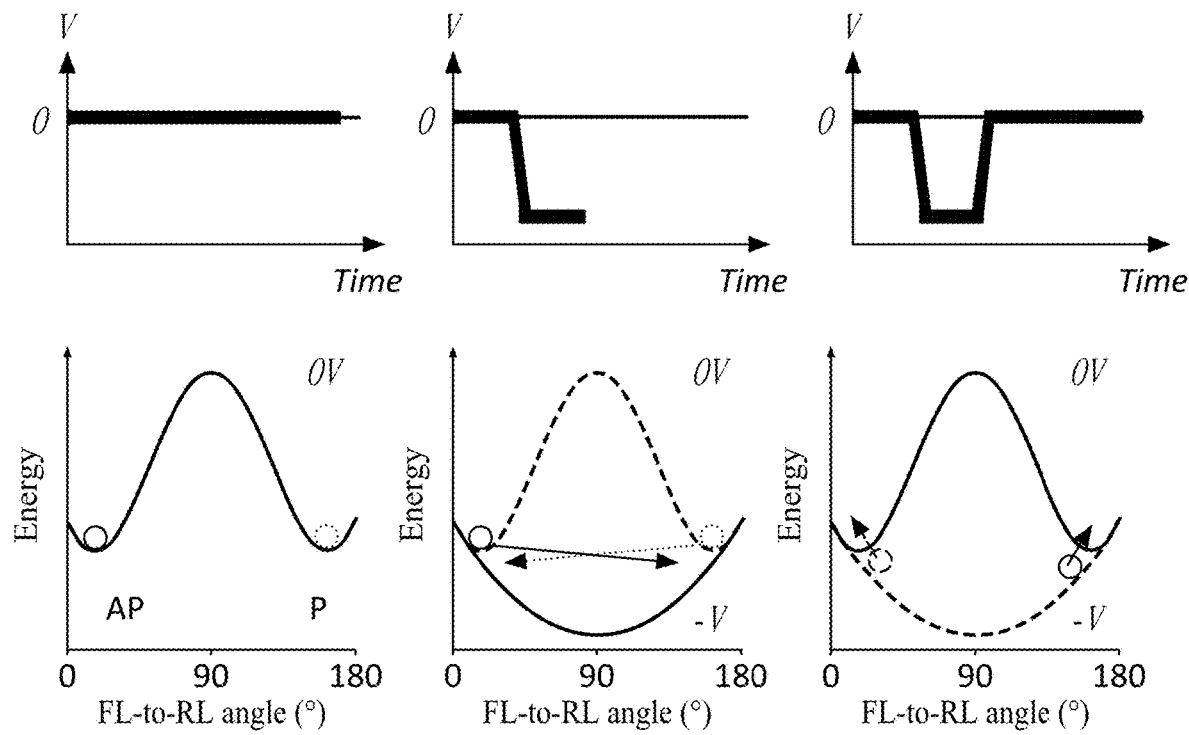
Fig. 1A   Fig. 1B   Fig. 1C
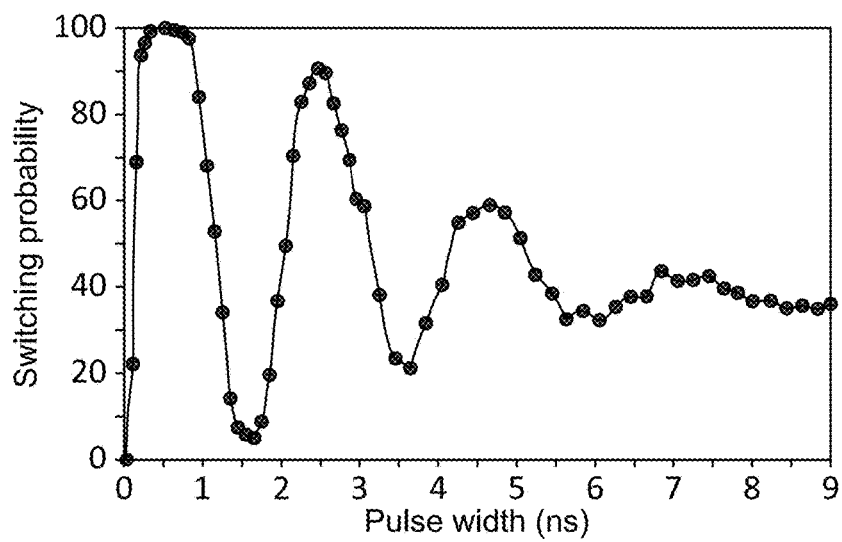
Fig. 2

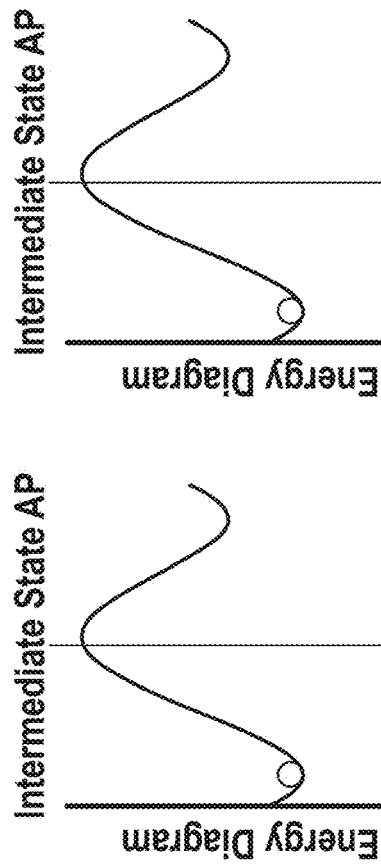
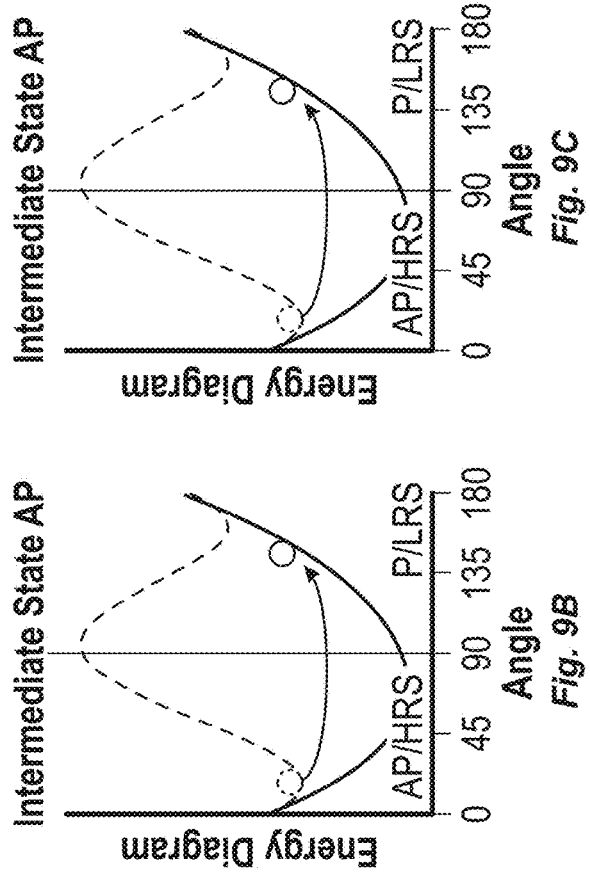
Fig. 8A
Fig. 8B
Fig. 8C
Fig. 9A
Fig. 9B
Fig. 9C

MEMORY DEVICE AND METHOD OF OPERATING A VOLTAGE-CONTROLLED MAGNETIC ANISOTROPY (VCMA) MAGNETIC TUNNEL JUNCTION (MTJ) DEVICE

CROSS-REFERENCE TO RELATED APPLICATIONS

This application claims foreign priority to European Application No. 20179677.8, filed Jun. 12, 2020, the contents of which are incorporated by reference herein in its entirety.

BACKGROUND

Technological Field

The disclosed technology relates to a memory device and a method of operating a voltage-controlled magnetic anisotropy (VCMA) magnetic tunnel junction (MTJ), device.

Description of the Related Technology

Magnetic random access memory (MRAM) is a promising memory technology allowing non-volatile data storage, high write and read speeds, and low power consumption. The non-volatile storage function of an MRAM device is provided by a magnetic tunnel junction (MTJ) device. A magnetic tunnel junction structure may include a free layer, a tunnel barrier layer, a reference layer, and a pinning layer. A magnetization state of the reference layer is fixed or pinned by the pinning layer. The direction of the magnetization of the free layer may be switched in relation to the reference layer between two different directions, which typically may correspond to a magnetic "parallel" ("P") state and a magnetic "anti-parallel" ("AP") state, respectively. The relative orientations of the magnetization of the reference layer and the free layer determine a resistance to current of the MTJ device. The MTJ device may present a lower resistance when the free layer is in the P state (that is, a "lower resistance state," abbreviated as "LRS") and a higher resistance when the free layer is in the AP state (that is, a "higher resistance state," abbreviated as "HRS"). The tunnel magneto-resistance ratio (TMR) is a measure of the difference in the MTJ electrical resistance between the AP state and the P state. Accordingly, by measuring the resistance of the MTJ, the magnetization state of the free layer may be sensed.

Current MRAM technology typically relies on spin-transfer-torque (STT) as the key switching mechanism of the free layer magnetization. However, STT writing may require a substantial amount of spin-polarized currents flowing through the oxide barrier of an MTJ, which may limit the power efficiency of the writing operation. Intense tunneling current can also degrade the tunnel barrier of the MTJs and thus affect the reliability of the memory cells.

Voltage-controlled magnetic anisotropy (VCMA) is another promising method to enable ultra-low power writing operations. In contrast to STT-aided free layer switching, VCMA employs a voltage pulse applied across the MTJ device to induce a voltage across the tunnel barrier. The voltage causes a precession of the free layer magnetization and hence allows switching of the MTJ between the AP and P states without any current flow through the device. VCMA accordingly enables reduced writing power as well as short write pulses.

The conventional VCMA write is a sequential read-write operation. Because both anti-parallel (AP) and parallel (P) states are equally stable, the AP-P and P-AP transitions share the same polarity write pulse. Hence to ensure a desired final state, a pre-read may be required to decide if writing is needed. For example, to write LRS, the write pulse should only be applied to HRS MTJ devices. This is because an MTJ device already in the LRS will switch to FIRS in response to the write pulse, and vice versa. Consequently, the entire write process of "read+evaluate+write" may reduce the time- and power-efficiency promised by VCMA writing.

SUMMARY OF CERTAIN INVENTIVE ASPECTS

An objective of the disclosed technology is to provide an improved approach for VCMA-aided switching of an MTJ device, enabling a writing process offering one or more of a reduced-complexity, improved power-efficiency and improved speed. Other objectives, features and advantages of the disclosed technology will appear from the present disclosure.

According to a first aspect of the disclosed technology, a method of operating a voltage-controlled magnetic anisotropy (VCMA) magnetic tunnel junction (MTJ) device is provided. The MTJ device is switchable between a first resistance state and a second resistance state, and a first threshold voltage for switching the MTJ device from the second resistance state to the first resistance state is lower than a second threshold voltage for switching the MTJ device from the first resistance state to the second resistance state. The method includes applying a first voltage pulse across the MTJ device with an amplitude having an absolute value equal to or greater than the first threshold voltage and lower than the second threshold voltage, thereby setting the MTJ device to the first resistance state regardless of whether the MTJ device is initially in the first or second resistance state.

According to a second aspect of the disclosed technology, a magneto-resistive memory device is provided. The device includes a voltage-controlled magnetic anisotropy (VCMA) magnetic tunnel junction (MTJ) device, wherein the MTJ device is configured to be switchable between a first resistance state and a second resistance state, and wherein a first threshold voltage for switching the MTJ device from the second resistance state to the first resistance state is lower than a second threshold voltage for switching the MTJ device from the first resistance state to the second resistance state. The magneto-resistive memory device also includes a driver circuit configured to apply a first voltage pulse across the MTJ device with an amplitude having an absolute value equal to or greater than the first threshold voltage and lower than the second threshold voltage.

The method and the device of the first and second aspects of the disclosed technology enable a deterministic setting of a resistive state of the MTJ device. That is, by applying the first voltage pulse across the MTJ device with an amplitude having an absolute value equal to or greater than the first threshold voltage and lower than the second threshold voltage, the MTJ device may be deterministically set to the first resistance state regardless of whether the MTJ device is initially in the first or second resistance state.

This obviates the need for a pre-read operation in the VCMA writing process. Without a pre-read, an overall duration and power consumption of the write process may be reduced.

In contrast to conventional VCMA technology employing an MTJ where the anti-parallel (AP) and parallel (P) states are equally stable, the various aspects of the disclosed technology use an MTJ with asymmetric switching behavior where the first threshold voltage (for switching from the second to first resistive state) is less than the second threshold voltage (for switching from the first to second resistive state). That is, a smallest magnitude of a voltage to be applied across the MTJ device for causing switching from the second to the first resistance state is lower than a smallest magnitude of a voltage to be applied across the MTJ device for causing switching from the first to the second resistance state. The first and second threshold voltages may be denoted $V_{T\{2\to1\}}$ and $V_{T\{1\to2\}}$, respectively.

The asymmetric switching behavior allows defining a first write window for switching to the first resistive state and a second write window for switching to the second resistive state. The first write window may be defined as $V_{T\{2\to1\}} \leq V_{L1} < V < V_{U1} \leq V_{T\{1\to2\}}$, where $V_{L1}$ and $V_{U1}$ are the lower and upper bounds, respectively, of the first write window. A second write window may be defined as $V_{T\{1\to2\}} \leq V_{L2} \leq V \leq V_{U2}$ where $V_{L2}$ is the lower bound of the second write window and $V_{U2}$ represents an optional upper bound (for example, selected such that the applied voltage reliably switches the MTJ without causing damage to the device).

The first voltage pulse may thus be adapted to switch the MTJ device from the second to the first resistive state (if the MTJ device is in the second resistive state prior to applying the first voltage pulse) and not switch the MTJ device from the first to the second resistive state (if the MTJ device is in the first resistive state prior to applying the first voltage pulse).

Since VCMA switching is insensitive to a polarity of the applied voltage, the threshold voltages are positive-valued thresholds. Accordingly, when reference is made herein to "magnitude" of a voltage, the absolute value of the voltage is intended.

The first resistance state of the MTJ may be a lower resistance state (LRS) and the second resistance state of the MTJ may be a higher resistance state (HRS), or vice versa. The LRS may correspond to a P state of the MTJ device (for example, the free layer magnetization oriented along a reference layer magnetization). The HRS may correspond to an AP state of the MTJ device (for example, the free layer magnetization oriented against a reference layer magnetization).

In VCMA switching, the dynamics of the free layer magnetization is dependent not only on the magnitude of the applied voltage but also on the duration of the applied voltage. Hence, a voltage is applied across the MTJ device as a first voltage pulse. By applying the first voltage pulse across the MTJ device a magnitude of a voltage across the MTJ device may be increased from a base line level less than the first threshold voltage, to a level equal to or greater than the first threshold voltage (and less than the second threshold voltage) for a duration, such that the MTJ device is switched from the second to the first resistive state, and then be returned to the base line level. In other words, a magnitude of a voltage applied across the MTJ device during the first voltage pulse may be at least the first threshold voltage (and less than the second threshold voltage) for a duration, such that the MTJ device is switched from the second resistive state to the first resistive state.

The method of the first aspect may further include, subsequent to the first voltage pulse, applying a second voltage pulse across the MTJ device with an amplitude having an absolute value equal to or greater than the second threshold value, thereby setting the MTJ device to the second resistance state.

The driver circuit of the device of the second aspect may further be configured to, subsequent to applying the first voltage pulse, apply a second voltage pulse across the MTJ device with an amplitude having an absolute value equal to or greater than the second threshold value.

Since the MTJ device subsequent to the first voltage pulse is set to the first resistive state, the MTJ device may subsequently be deterministically switched to the second resistive state. Accordingly, regardless of an initial resistive state of the MTJ device, the MTJ device may be deterministically set to the second resistive state.

In correspondence with the above discussion of the first voltage pulse, by applying the second voltage pulse across the MTJ device, a magnitude of a voltage across the MTJ device may be increased from the base line level, to a level equal to or greater than the second threshold voltage for a duration, such that the MTJ device is switched from the first to the second resistive state, and then be returned to the base line level. In other words, a magnitude of a voltage applied across the MTJ device during the second voltage pulse may be at least the second threshold voltage for a duration, such that the MTJ device is switched from the first resistive state to the second resistive state.

The first voltage pulse and/or the second voltage pulse may each be a rectangular voltage pulse. The amplitude of the rectangular voltage pulse may fall within the first write window (that is, for the first voltage pulse) or the second write window (that is, for the second voltage pulse). Changing a voltage from a first level to a second level is in practice typically associated with a non-zero rise time or fall time, for example due to line and device capacitances. Accordingly, the term "rectangular voltage pulse" is hereby intended to cover also trapezoidal pulses.

The act of applying the first voltage pulse may form part of a "reset operation" of the write operation. That is, the MTJ device may be "reset" to the first resistive state regardless of the initial state. The first voltage pulse may hence be referred to as a "reset" voltage pulse. Correspondingly, the applying of the second voltage pulse may form part of a "set operation" of the write operation. That is, the MTJ device may be set to the second resistive state. The second voltage pulse may hence be referred to as a "set" voltage pulse.

Applying the first voltage pulse across the MTJ device may include, while supplying a voltage of a first reference level to a first electrode of the MTJ device, supplying a third voltage pulse to a second electrode of the MTJ device. Applying the second voltage pulse across the MTJ device may include, while supplying a voltage of a second reference level to the first electrode of the MTJ device, supplying a fourth voltage pulse to the second electrode of the MTJ device A voltage pulse (a pulsed voltage) may hence be applied across the MTJ device (that is, between the first and second electrodes), by supplying a voltage pulse to the second electrode while supplying a reference level voltage to the first electrode (for example by connecting the second electrode to a reference voltage source).

The first reference level and the amplitude of the third voltage pulse may be such that that an absolute value of a difference thereof is equal to or exceeds the first threshold voltage (and is less than the second threshold voltage). The second reference level and the amplitude of the fourth voltage pulse may be such that that an absolute value of a difference thereof is equal to or exceeds the second threshold voltage. The third and/or fourth voltage pulse may each be a rectangular pulse.

The first electrode and the second electrode may be a bottom electrode and a top electrode, respectively, of the MTJ device. However, the opposite configuration is also possible.

An amplitude of the third voltage pulse may be equal to an amplitude of the fourth voltage pulse, and the first reference level differs from the second reference level.

This allows timing control and voltage control (that is, magnitude of the pulses) to be separated to two different control lines connected to the first and second terminals, respectively. The control lines may, for example, be a bit line and a word line. Separate timing and voltage control may facilitate circuit implementation as short pulses with short rise and fall times may be generated using drive transistors operating at full strength/full supply voltage, which may be offset by the first or second reference voltage level to obtain a net voltage of a desired magnitude across the MTJ device (for example within the first write or second write window). Accordingly, the third and fourth voltage pulses may be identical pulses.

According to an alternative, the first reference level may be equal to the second reference level, and the amplitude of the fourth voltage may be different from the amplitude of the third voltage pulse.

A duration of the first pulse may be greater than a duration of the second pulse.

This is based on the insight that a greater magnitude of a voltage across the MTJ device may result in a faster precession of the free layer magnetization. A high switching probability may hence be achieved in a shorter time by the second voltage pulse.

A probability of switching the MTJ device from the first resistive state to the second resistive state may oscillate as a function of a duration of the second voltage pulse, and wherein a duration of the second pulse is less than a period of the oscillatory function.

This enables the switching to be achieved in as short time as possible. This also ensures that the MTJ device is not switched back to the first resistive state. The duration may advantageously be such that that the oscillatory function assumes a maximum value (for example, within the first period).

The MTJ device may be an MTJ device of a set of VCMA MTJ devices and the method may include applying the first voltage pulse across each one of a first subset of the MTJ devices, thereby setting each one of the first subset of MTJ devices to a respective first resistance state regardless of a respective initial resistance state of the first subset of MTJ devices; and applying the first voltage pulse and then the second voltage pulse across each one of a second subset of the MTJ devices, thereby setting each one of the second subset of MTJ devices to a respective second resistive state regardless of a respective initial resistance state of the second subset of MTJ devices.

The memory device may further include a plurality of memory cells, each memory cell including a VCMA MTJ device. Each MTJ device may be configured to be switchable between a first resistance state and a second resistance state. For each MTJ device, a first threshold voltage for switching the MTJ device from the second resistance state to the first resistance state is lower than a second threshold voltage for switching the MTJ device from the first resistance state to the second resistance state. The driver circuit of the device may further be configured to apply the first voltage pulse across each one of a first subset of the MTJ devices, and apply the first voltage pulse and then the second voltage pulse across each one of a second subset of the MTJ devices.

According to this approach, a first subset of a plurality of MTJ devices may be deterministically switched/set to the first resistive state while a second subset (that is, the "selected" subset) may be deterministically switched/set to the second resistive state.

As may be appreciated, the second resistive state may (for the second subset of MTJ devices) represent a "final" state, wherein the first resistive state represents an "intermediate" state. However, if the desired resistive state of the MTJ device is the first resistive state (for example, for the first subset of MTJ devices), the first resistive state of the MTJ device subsequent to the first voltage pulse may represent the "final" state.

As may be appreciated, the (resistive) state of a MTJ device prior to the first/reset voltage pulse may represent an "initial" state of the MTJ device.

Consequently, during the write operation, the first subset of MTJ devices may be reset from an initial state (first or second resistive state) to the final first resistive state. During the write operation, the second subset of MTJ devices may be reset from an initial state (first or second resistive state) to an intermediate first resistive state and subsequently be set to the final second resistive state.

Each memory cell may be configured to store any one of a first and a second binary value ("0" and "1", or "1" and "0") as a first and second resistive state, respectively, of the MTJ device of the memory cell.

A set of bits, each bit representing the first or the second binary value to be stored in a respective one of the memory cells, may be received, for example by a data buffer of the memory device. The first voltage pulse may be applied across the MTJ device of each memory cell in which the first binary value is to be stored, for example by a driver circuit of the memory device. A sequence of the first voltage pulse and then the second voltage pulse may be applied across the MTJ device of each memory cell in which the second binary value is to be stored, for example by the driver circuit of the memory device.

Data in the form of a set of bits may accordingly be written for non-volatile storage by the MTJ devices of the memory cells.

The memory device may further include a plurality of bit lines and a plurality of word lines. Each memory cell may be connected between a respective pair of the bit lines and the word lines.

Each memory cell may include a transistor having a first terminal, a second terminal connected to a voltage source, and a gate terminal connected to one of the word lines, wherein the MTJ device of each memory cell is connected between one of the bit lines and the first terminal of the transistor of the memory cell. Each memory cell may hence be configured as a 1 transistor-1 MTJ cell ("1T1MTJ"). A 1T1MTJ memory cell configuration enables an area efficient memory array. Individual memory cells may be selected for read and write by controlling a word line voltage.

The driver circuit may be configured to: in applying the first voltage pulse across the MTJ device of any one of the memory cells, control a timing and a duration of the first voltage pulse via the word line and an amplitude of the first voltage pulse via the bit line; and, in applying the second voltage pulse across the MTJ device of any one of the memory cells, control a timing and a duration of the second voltage pulse via the word line and an amplitude of the second voltage pulse via the bit line. This allows timing and voltage control to be separated between the word line and bit line, facilitating circuit implementation and thus conferring the related advantages discussed above.

The MTJ device of each memory cell may include a first terminal connected to one of the bit lines and a second terminal connected to one of the word lines. The second terminal is connected to the word line via a selector of the memory cell. The selector may be a two-terminal selector, such as a diode selector. Each memory cell may hence be configured as a 1 selector-1 MTJ cell ("1S1MTJ"). A 1S1MTJ memory cell configuration enables an area efficient memory array. Additionally, a variety of efficient two-terminal selectors exist which enable integration in BEOL, enabling further area efficiency. Individual memory cells may be selected for read and write by controlling a word line voltage.

Alternatively, the second terminal of the MTJ device of each memory cell may be directly connected to the word line connected to the memory cell. This implementation allows for an area efficient 0 selector-1MTJ cell ("0S1MTJ") and may advantageously be used for analog in-memory computing (AiMC). AiMC is an application where no regular selective memory cell read-out is needed. Rather all memory cells may be activated in parallel to perform matrix-vector multiplication. A deterministic writing process, as discussed herein, may be especially advantageous as a conventional read-before-write operation could be complex and expensive to implement.

For both the 1 S1MTJ and 0S1MTJ memory cell configurations, the memory device may be configured to: in applying the first voltage pulse across the MTJ device of any one of the memory cells, control a timing and a duration of the first voltage pulse via the word line and an amplitude of the first voltage pulse via the bit line, or vice versa; and, in applying the second voltage pulse across the MTJ device of any one of the memory cells, control a timing and a duration of the second voltage pulse via the word line and an amplitude of the second voltage pulse via the bit line, or vice versa.

Similar to the above discussion, this allows timing and voltage control to be separated between the word line and bit line.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings, like reference numerals will be used for like elements unless stated otherwise.

FIGS. 1A-1C illustrate a conventional VCMA switching process.

FIG. 2 shows an oscillatory switching probability function.

FIGS. 8A-8C, 9A-9C, and 10A-10C illustrate switching of an MTJ device with a sequence of a reset and a set voltage pulse.

DETAILED DESCRIPTION OF CERTAIN ILLUSTRATIVE EMBODIMENTS

In a conventional VCMA MTJ device, the anti-parallel and parallel magnetization states (AP and P, respectively) of the free layer are equally stable. This implies that the threshold electrical field strength (or equivalently threshold voltage) to trigger state switching from AP to P, or vice versa, are equal. The energy diagram for the AP and P is hence symmetric, as schematically shown in FIG. 1A, for a zero-voltage voltage across the MTJ device (that is, no external electrical field applied across the MTJ). The solid line circle indicates an initial AP free layer magnetization. The dashed circle indicates an initial P free layer magnetization. In FIG. 1B, a voltage pulse of amplitude −V, sufficient for exceeding the energy barrier for triggering state switching, is applied. The full line represents the resulting energy diagram. The applied voltage induces a precession of the free layer magnetization about the effective magnetic field vector. The precession results in a time-dependent oscillatory switching probability for switching the free layer magnetization from the initial state (for example, P or AP) to the opposite state (for example, AP or P). During a first period of the oscillation, a switching probability of 100% may be readily achieved. However, the free layer dynamics include, in addition to the precession component, a damping component. The maximum switching probability for each consecutive period will hence decrease.

FIG. 2 illustrates an oscillatory switching probability as a function of pulse width (that is, duration of the applied voltage pulse) for an example VCMA MTJ device. As may be seen, a maximum switching probability may be obtained for a pulse width of approximately half a period. FIG. 1C schematically shows the result for a half period pulse width. Hence, the MTJ has been switched from AP to P (solid line circle), or from P to AP (dashed circle).

Figure 3:
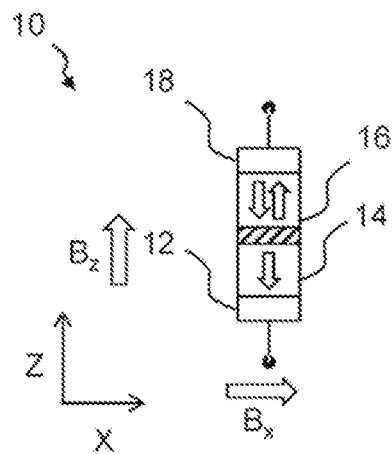
FIGS. 3 and 4 schematically illustrate MTJ devices supporting a deterministic VCMA switching process.
Figure 4:
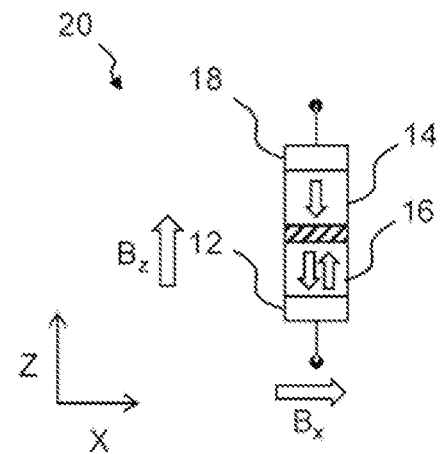

FIGS. 3 and 4 schematically illustrate two variations of MTJ devices 10, 20 allowing a deterministic VCMA writing process, as will be disclosed further below.

The MTJ devices 10, 20 include a pinned layer 14 and a free layer 16. The pinned layer 14 may more specifically include a combination of a reference layer (also known as a "fixed layer") and a pinning layer. The arrow Z indicates a vertical direction, for example normal to (a main surface of) a substrate supporting the MTJ device 10, 20. Meanwhile, the arrow X indicates a horizontal direction, for example along (a main surface of) a substrate supporting the MTJ device 10, 20. The directions Z and X may also be referred to as an out-of-plane and in-plane direction, respectively, with respect to the layers of the MTJ device 10, 20. Accordingly, the MTJ device 10 is "bottom-pinned." That is, the pinned layer "14" is arranged vertically below the free layer 16. Meanwhile, the MTJ device 20 is "top-pinned," where the pinned layer 14 is arranged vertically above the free layer 16.

The pinned and free layers 14, 16 of the MTJ device 10, 20 are arranged between a first electrode and a second electrode, which in the frame of reference of FIGS. 3 and 4 correspond to a bottom electrode 12, and a top electrode 18. It should however be noted that "first electrode" and "second electrode" more generally may refer to either a bottom and a top electrode, respectively, or a top and a bottom electrode, respectively.

The variable magnetization direction of the free layer 16 of the MTJ device 10, 20 and the fixed magnetization direction of the pinned layer 14 are indicated in the figures by a pair of oppositely oriented arrows and a single arrow, respectively. The arrows schematically indicate the orientation of the magnetization of the pinning layer 14, and the two possible orientations of the magnetization of the free layer 16. The downward orientation of the arrow in the pinned layer 14 just represents an example and a downward orientation is equally possible.

The "magnetization" of a layer hereby refers to the net magnetization of the layer, that is, equivalent to the sum of the elementary magnetic moments of the layer, unless explicitly stated otherwise. The (net) magnetization may be described by a "magnetization vector." Accordingly, a direction or an orientation of a magnetization of a layer may be understood to refer to the direction or orientation of the (net) magnetization vector of the layer.

As suggested by the out-of-plane/vertical orientations of the arrows in the MTJ device 10, 20, the free layer 14 and pinned layer 16 may present a perpendicular magnetic anisotropy (PMA). However, it may be noted that MTJ devices with an in-plane magnetic anisotropy are also possible.

Although the free layer 14 and the pinned layer 16 are illustrated and referred to as respective "layers," a free layer and a pinned layer may as known in the art be formed as composite layer structures including a plurality of layers. For example, the pinned layer (structure) 14 structure may include a reference layer (also known as a fixed layer) and a pinning layer configured to exert a pinning effect on the magnetization of the reference layer. The reference layer and the pinning layer may each include one or more ferromagnetic layers. Synthetic antiferromagnetic (SAF) as well as synthetic ferromagnetic (SFM) pinning layer configurations are possible. For the free layer 14, single- as well as double-free layer configurations are possible.

The pinned layer 14 and the free layer 16 are separated by a tunnel barrier layer, for example having a thickness of a few angstrom (Å). The tunnel barrier layer may be adapted to allow electrons to tunnel between the pinned layer 14 and the free layer 16. The tunnel barrier layer may be a non-magnetic and electrically insulating layer, typically an oxide layer.

Non-limiting examples of suitable materials for VCMA MTJ devices with PMA include Fe, Co, FeB, CoB, CoFe and CoFeB for the free and pinned layer, and MgOx, AlOx and MgAlOx for the tunnel barrier layer. Suitable materials for devices based with in-plane magnetic anisotropy can be implemented.

As discussed above, the magnetization of the free layer 16 can be switched to be oriented along (the P state, corresponding to an LRS) or against the magnetization of the pinned layer 14 (the AP state, corresponding to an HRS).

In contrast to the conventional VCMA device described in connection with FIGS. 1A-1C and 2, the MTJ devices 10, 20 are configured to present an asymmetric switching behavior. That is, a first threshold voltage $V_{T\{2 \to 1\}}$ for switching the MTJ device 10, 20 from the second resistance state to the first resistance state is lower than a second threshold voltage $V_{T\{1 \to 2\}}$ for switching the MTJ device 10, 20 from the first resistance state to the second resistance state.

It is to be noted that "first resistance state" and "second resistance state" generally may be used to refer to an LRS and an HRS, respectively, or an HRS and an LRS, respectively. In the following description however, to facilitate understanding, the first and second resistance states may be referred to as the LRS and the HRS, respectively. Adopting this convention, the first threshold voltage $V_{T\{2 \to 1\}}$ may be denoted $V_{T,AP}$ and the second threshold voltage $V_{T\{1 \to 2\}}$ may be denoted $V_{T,P}$.

An asymmetric switching behavior may be realized by applying an external magnetic field oriented in an out-of-plane direction Z (for example, as schematically indicated by the field $B_z$ in FIGS. 3 and 4). An intrinsic implementation is also possible by designing the pinned layer 14 (for example, by adapting the magnetic moments, the thicknesses and/or material compositions of the reference layer and the pinning layer) to generate a magnetic stray field $B_z$ causing a switching asymmetry. However, more generally any method allowing the disclosed switching asymmetry to be introduced in the MTJ device may be employed for the purpose of the deterministic VCMA writing process.

FIGS. 3 and 4 further indicate a magnetic field $B_x$ providing an in-plane component to the effective magnetic field vector about which the free layer magnetization precession occurs. For a PMA MTJ device 10, 20, the magnetic field $B_x$ may have an in-plane orientation, that is, with respect to the free layer 16. The magnetic field $B_x$ may be an external magnetic field provided by a ferromagnetic layer with an in-plane magnetic anisotropy, for example arranged underneath or on top of the layer stack of the MTJ device 10, 20. As may be understood, for the MTJ devices 10, 20 the magnetic fields $B_z$ and $B_x$ may in combination produce an effective magnetic field vector which deviates from an in-plane direction. For an MTJ device 10, 20 with an in-plane magnetic anisotropy, the asymmetry inducing out-of-plane magnetic field $B_z$ would be replaced by a corresponding in-plane magnetic field and the in-plane magnetic field $B_x$ would be replaced by a corresponding out-of-plane magnetic field.

A method of operating an VCMA MTJ device with an asymmetric switching behavior will now be disclosed. More specifically, methods for controlling the magnetization state and, hence the resistive state, of an VCMA MTJ device, such as any of the MTJ devices 10, 20, will be disclosed with reference to FIGS. 5A-5C through 10A-10C. The methods allow deterministic VCMA switching/writing, obviating the need for the pre-read of the conventional VCMA write approach.

Figure 5B:
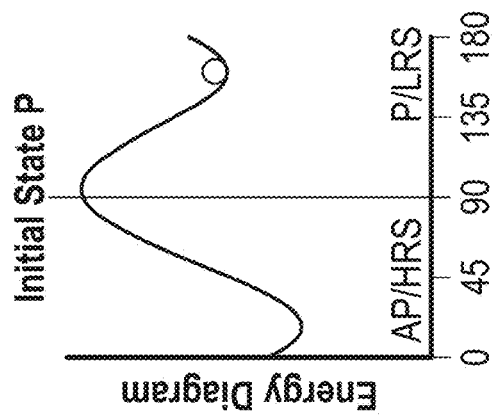
FIGS. 5A-5C, 6A-6C, and 7A-7C illustrate switching of an MTJ device with a reset voltage pulse.
Figure 5C:
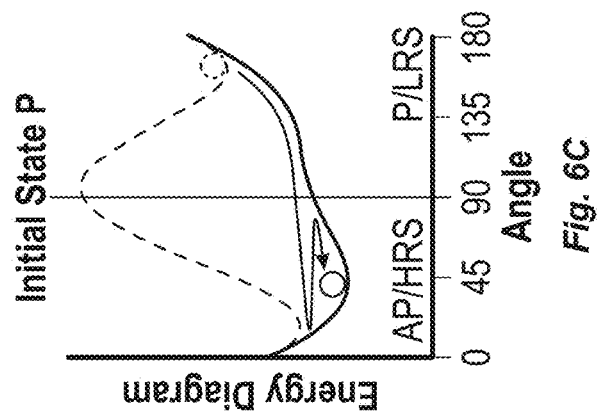
Figure 6B:
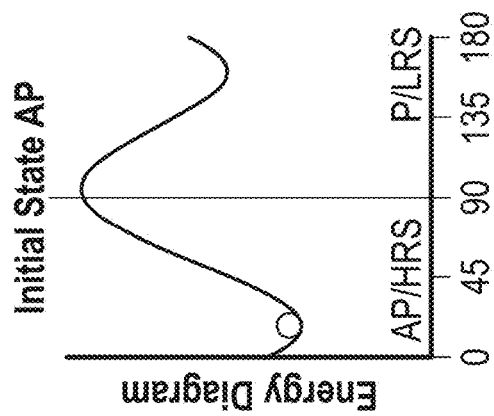
Figure 6C:
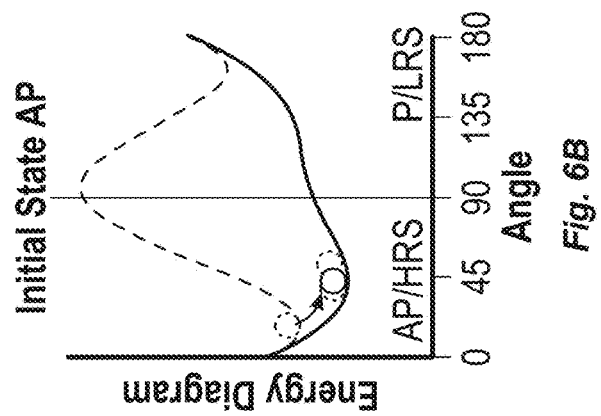
Figure 5A:
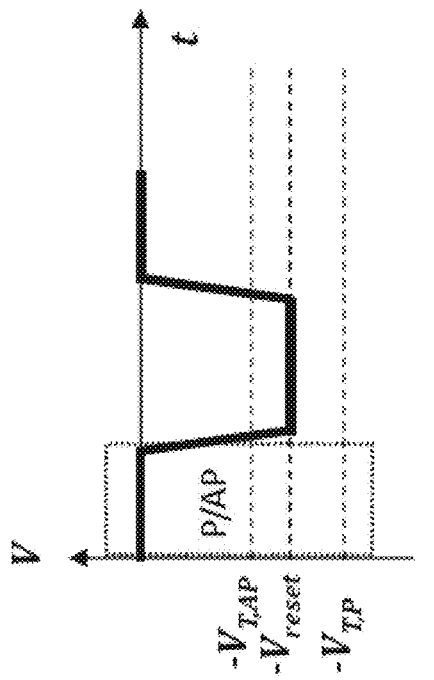
Figure 6A:
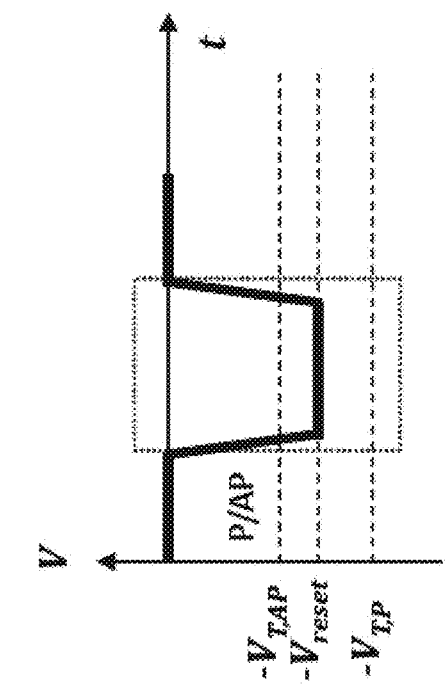
Figure 7C:
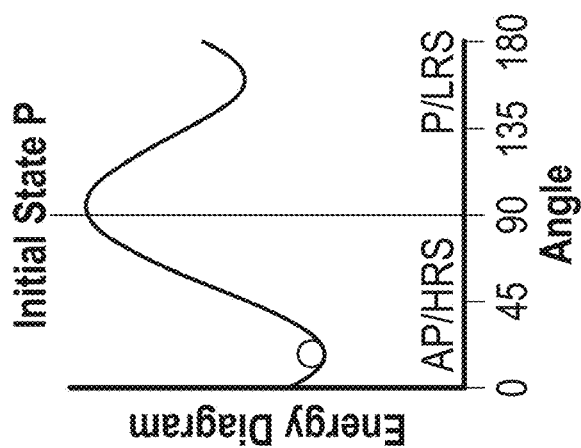
Figure 7B:
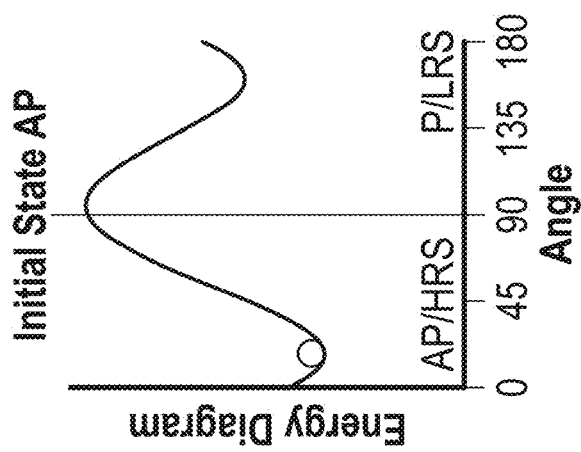
Figure 7A:
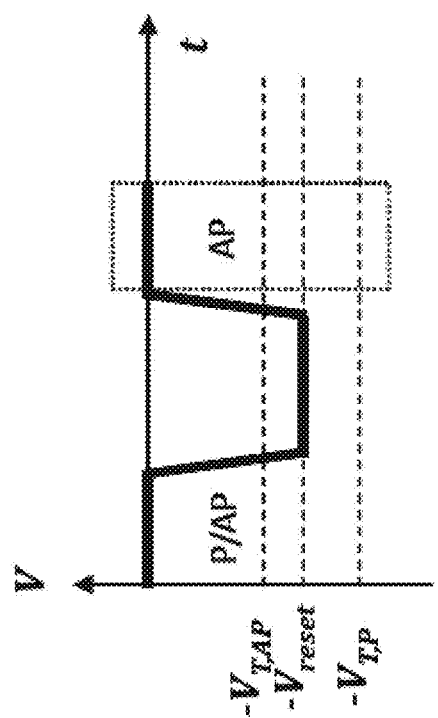

FIGS. 5A-5C through 7A-7C illustrate a deterministic switching of the magnetization state of the MTJ device to AP/HRS. FIGS. 5A, 6A, and 7A illustrate a first voltage pulse which is applied across the MTJ device. FIGS. 5B, 6B, and 7B illustrate the energy diagram for the VCMA state switching for the time intervals indicated by the dashed box in FIGS. 5A, 6A, and 7A, respectively. That is, before applying the first voltage pulse (FIG. 5B), while the first voltage pulse is applied (FIG. 6B), and after the first voltage pulse has been applied (FIG. 7B). The circles in FIGS. 5B, 6B, and 7B indicate the respective magnetization states of the MTJ device. FIGS. 5B, 6B, and 7B illustrate the influence of the first voltage pulse for an MTJ device initially in AP/HRS. FIGS. 5C, 6C, and 7C correspond to FIGS. 5B, 6B and 7B however for an MTJ device initially in P/LRS.

The different energy barriers for switching from P/LRS to AP/HRS may be seen from the asymmetrically shaped energy diagrams. The corresponding threshold voltages $V_{T,AP}$ and $V_{T,P}$ are indicated in the timing diagram. The first voltage pulse (which for illustrative purposes is indicated to be of a negative polarity) has an amplitude of $-V_{reset}$. The absolute value of the amplitude of the first voltage pulse is equal to or greater than the first threshold voltage $V_{T,AP}$ (in the figures, greater than) and smaller than the second threshold voltage $V_{T,P}$, that is, $V_{T,AP} \leq V_{reset} < V_{T,P}$. This voltage range defined by $V_{T,AP}$ and $V_{T,P}$ corresponds to a first write window.

If the MTJ device is initially in AP/HRS (FIG. 5B), the magnitude of the first voltage pulse is insufficient to switch the MTJ device to P/LRS (FIG. 6B), wherein the MTJ device subsequent to the first voltage pulse remains in AP/HRS (FIG. 7B).

If the MTJ device is initially in P/LRS (FIG. 5C), the magnitude of the first voltage pulse is sufficient to switch the MTJ device to AP/HRS (FIG. 6C), wherein the MTJ device subsequent to the first voltage pulse has been switched to AP/HRS (FIG. 7C).

The MTJ device may thereby be set to AP/HRS (more generally the first resistance state) regardless of whether the MTJ device is initially in AP/HRS or P/LRS (more generally the first or second resistance state). As the first voltage pulse serves to "reset" the MTJ device to the AP/HRS, the first voltage pulse may be referred to as a "reset voltage pulse."

If AP/HRS is the desired final state of the MTJ device, the switching process for the MTJ device is complete and no further voltage pulses need be applied. However, if the P/LRS is the desired state of the MTJ device, an additional second voltage pulse may be applied across the MTJ device as will be disclosed with reference to FIGS. 8A-8C through 10A-10C.

Figure 10C:
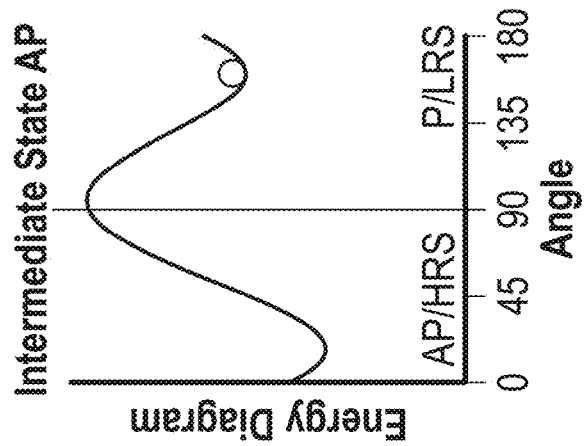
Figure 10B:
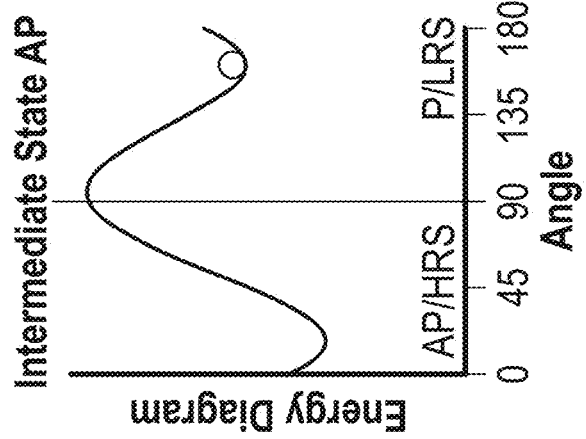
Figure 10A:
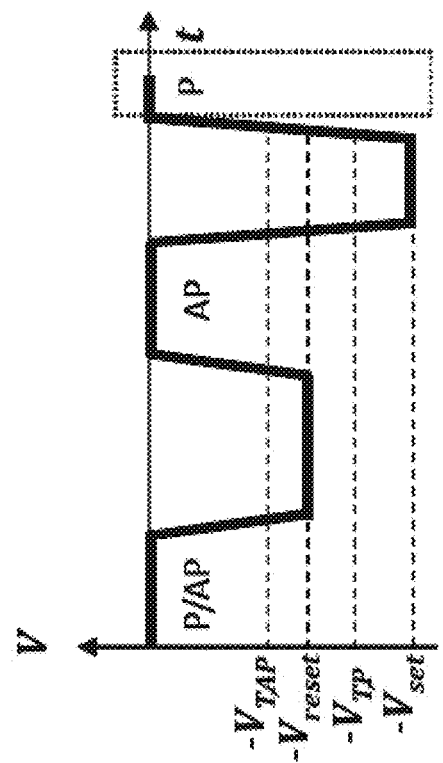

FIGS. 8A, 9A and 10A illustrate the first/reset voltage pulse and the subsequent second voltage pulse which is applied across the MTJ device. FIGS. 8B, 9B, and 10B illustrate the energy diagram for the VCMA state switching for the time intervals indicated by the dashed box in FIGS. 8A, 9A, and 10A, respectively. That is, before applying the second voltage pulse (FIG. 8B), while the second voltage pulse is applied (FIG. 9B), and after the second voltage pulse has been applied (FIG. 10B). The circles in FIGS. 8B, 9B, and 10B indicate the respective magnetization states of the MTJ device.

As the second voltage pulse is applied subsequent to the reset voltage pulse, the MTJ device is, prior to the second voltage pulse in AP/HRS, representing an intermediate state of the MTJ device. FIGS. 8B, 9B, and 10B are hence identical to FIGS. 8C, 9C, and 10C.

The second voltage pulse has an amplitude of $-V_{set}$. The absolute value of the amplitude of the second voltage pulse is equal to or greater than the second threshold voltage $V_{T,P}$ (in the figures, greater than), that is, $V_{set} > V_{T,P}$. This voltage range defined by $V_{T,P}$ corresponds to a second write window.

The magnitude of the second voltage pulse is hence sufficient to switch the MTJ device to P/LRS (FIG. 9B), wherein the MTJ device subsequent to the second voltage pulse has been switched to the P/LRS (FIG. 10B).

The MTJ device may hence, by a sequence of the reset voltage pulse and the second voltage pulse, be set to P/LRS (more generally the second resistance state) regardless of whether the MTJ device initially is in AP/HRS or P/LRS (more generally the first or second resistance state). As the second voltage pulse serves to "set" the MTJ device to P/LRS, the second voltage pulse may be referred to as a "set voltage pulse." As P/LRS corresponds to the desired final state, the switching process for the MTJ device is complete and no further voltage pulses need be applied.

As shown in the figures, the reset and/or set voltage pulse may each be a rectangular voltage pulse. The reset voltage pulse may cause a voltage across the MTJ device to transition from a base line level (for example, in the figures a zero voltage), to a constant amplitude or peak level of $-V_{reset}$ (that is, a magnitude of $V_{reset}$) which is maintained during a first time interval (that is, of a first duration), and then transition back to the base line level. Correspondingly, the set voltage pulse may cause a voltage across the MTJ device to transition from the base line level, to a constant amplitude or peak level of $-V_{set}$ (that is, a magnitude of $V_{set}$) which is maintained during a second time interval (that is, of a second duration), and then transition back to the base line level.

The reset voltage pulse may be applied across the MTJ device by supplying a "third" voltage pulse to one of the electrodes of the MTJ device (such as the bottom electrode 12 or the top electrode 18 of the MTJ device 10, 20) while supplying a voltage of a "first" reference level to the other one of the electrodes of the MTJ device (for example, the top electrode 18 or the bottom electrode 12). The third voltage pulse (which, for example, may be a rectangular pulse) may be obtained by changing the voltage from a base line level to a (first) peak level (negative or positive with respect to the base line level) and back again to the base line level. The base line level may for example be equal to the first reference level such that a zero voltage across the MTJ device is obtained before and after the voltage pulse. The amplitude of the first voltage pulse may thus be determined by the difference between the amplitude of the third voltage pulse and the first reference level.

The set voltage pulse may be applied in a corresponding manner, by applying a fourth voltage pulse to one of the electrodes, for example, by changing the voltage from a base line level to a (second) level (negative or positive with respect to the base line level), while supplying a voltage of a second reference level (for example, equal to the base line level) to the other one of the electrodes. The amplitude of the second voltage pulse may thus be determined by the difference between the amplitude of the fourth voltage pulse and the second reference level.

The different amplitudes of the first and second voltage pulses may be achieved by varying the amplitudes of the third and fourth voltage pulses while keeping the first and second reference levels equal. Alternatively, the amplitudes of the third and fourth voltage pulses may be equal while the first and second reference levels are varied. The first and second reference levels may for example be supplied by a controlled voltage source. The pulsed voltages may be supplied by any suitable pulse generator capable of providing voltage pulses of pulse widths (that is, durations) suitable for VCMA switching.

As discussed above, the respective durations of the first and second voltage pulses may be set such that a switching probability is maximized. The pulse widths may, for example, be established through simulations and/or by testing various durations and measuring a resulting resistance of the MTJ device. For the second voltage pulse, a starting point for a pulse width optimization may, by way of example, be half a period of the oscillatory state switching probability. Typically, a pulse width of the second voltage pulse may be less than a pulse width of the first voltage pulse as the greater magnitude of the second voltage pulse may induce a faster precession of the magnetization of the free layer 16. Hence, a suitable starting point for a pulse width optimization for the first voltage pulse may, by way of example, be a pulse width equal to or less than the pulse width of the second voltage pulse.

Figure 11:
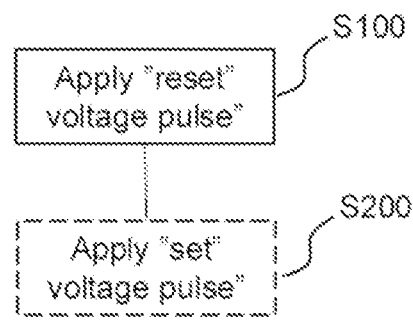
FIG. 11 is a flow chart of a VCMA switching process.

FIG. 11 is a schematic flow chart showing the acts for the deterministic VCMA switching/writing process of applying the reset voltage pulse S100 and, optionally, subsequently applying the set voltage pulse S200. As may be appreciated, a practical use case of the writing process may involve writing to a plurality of VCMA MTJ devices configured in the manner discussed above. Accordingly, the act of applying the reset voltage pulse (S100) may be applied to each one of a first subset of the MTJ devices, thereby setting each one of the MTJ devices to a respective first resistance state (for example, AP/HRS) regardless of a respective initial resistance state of the MTJ devices (for example, AP/HRS or P/LRS). Meanwhile, a sequence of the reset voltage pulse and the set voltage pulse (S100, S200) may be applied to a second subset of the MTJ devices, that is, those MTJ devices for which the second resistive state (for example, P/LRS) corresponds to the desired final state. Thereby, each one of the first subset of MTJ devices may be set to a respective first resistive state (for example, AP/HRS) and each one of the second subset of MTJ devices may be set to a respective second resistive state (for example, P/LRS).

Figure 12A:
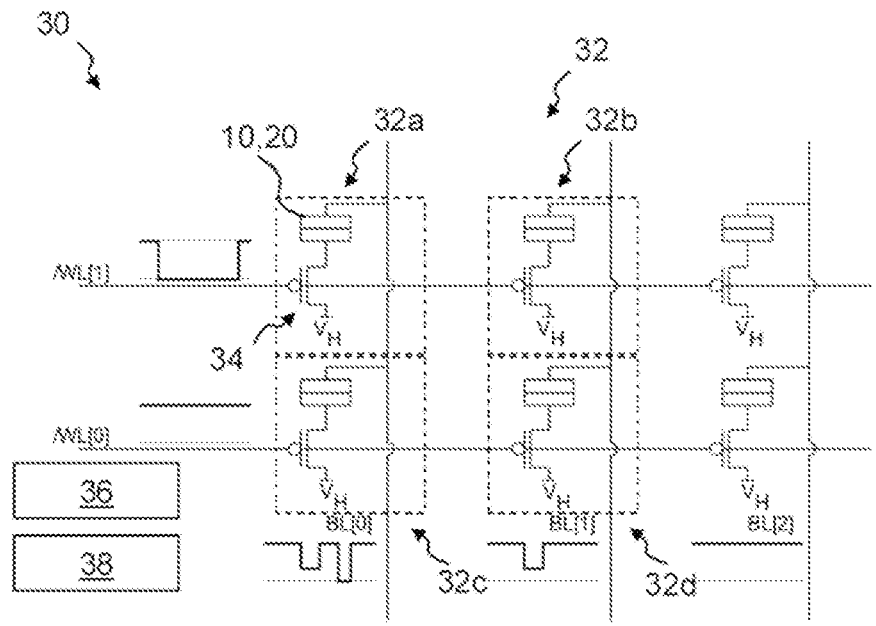
FIGS. 12A-12B schematically illustrate variations of a memory device with 1T1MTJ memory cells.

FIG. 12A illustrates a magneto-resistive memory device 30, such as a magnetic random access memory (MRAM). The memory device 30 includes a plurality of memory cells 32a, 32b, 32c, 32d and so forth (collectively referred to by the reference sign 32), arranged, for example, in a plurality of rows and a plurality of columns of a memory array of the memory device 30.

The memory device 30 includes a plurality of bit lines BL and a plurality of word lines WL. Each memory cell 32 is connected between a respective pair of a bit line BL and a word line WL, such as memory cell 32c between BL[0] and WL[0], memory cell 32a between BL[0] and WL[1], memory cell 32d between BL[1] and WL[0], and memory cell 32b between BL[1] and WL[1].

Each memory cell 32 includes a VCMA MTJ device, such as the MTJ device 10 or 20 discussed in connection with FIGS. 3 and 4. Each memory cell 32 forms a 1T1MTJ memory cell and accordingly further includes a transistor 34, configured as select transistor of the memory cell 32. Each memory cell 32 may, as shown, further include a voltage source supplying a voltage of a reference level $V_H$ (hereinafter referred to as the reference voltage $V_H$). The voltage $V_H$ may for example be supplied by a constant or controlled voltage source. An individual voltage source need not, however, be arranged in each cell, but the reference voltage $V_H$ may, for example, be supplied by a single voltage source common to all memory cells 32, or by a number of voltage sources each common to memory cells 32 arranged along a same bit line or word line.

The transistor 34 of each memory cell 32 includes a gate terminal and a first and second terminal forming a pair of source/drain terminals of the transistor 34. The gate terminal is connected to the word line connected to the respective memory cell 32 (for example, WL[1] for memory cell 32a). The first terminal is connected to a first electrode of the MTJ device 10, 20, forming a bottom electrode 12. The second terminal of the transistor 34 is connected to the voltage source. The MTJ device 10, 20 is hence switchably connected to the reference voltage VH, by the transistor 34. A second electrode of the MTJ device 10, 20, forming a top electrode 18, is connected to the bit line. In the example of FIG. 12a, the bottom electrode 12 is connected to the transistor 34 and the top electrode 18 is connected to the bit line. However, an opposite configuration is also possible wherein the top electrode 18 is connected to the transistor 34 and the bottom electrode 12 is connected to the bit line.

The MTJ device 10, 20 of each memory cell 32 may be switched between two magnetic states providing different resistance (for example, AP/HRS and P/LRS). By associating AP/HRS with a first binary value (for example, "0" or "1") and P/LRS with a second binary value (for example, "1" or "0"), data in the form of a plurality of bits may be written to the memory cells 32 for non-volatile storage. Data may be read out in a conventional fashion, for example by read-out circuitry configured to detect which resistance state the MTJ device 10, 20 of a memory cell 32. Both voltage- and current-sensing schemes are possible.

An operation of writing a sequence of bits to the memory cells 32 of the memory device 30 may proceed in accordance with the method described in connection with FIG. 11. The memory device 30 may include a driver circuit 36 configured to control the application of the reset and set voltage pulses via the word lines and the bit lines. The memory device 30 may further include a data buffer 38 configured to receive the set of bits for volatile storage until written to the memory cells 32. The driver circuit 36 may apply the reset voltage pulse across the MTJ device 10, 20 of each memory cell 32 which is to store the first binary value, and a sequence of a reset voltage pulse and a set voltage pulse across the MTJ device 10, 20 of each memory cell 32 which is to store the second binary value.

With reference to FIG. 12A, a writing operation may, as an example, proceed as follows. In a first step, the memory cells 32 may be set to a rest state by supplying the reference voltage $V_H$ to each bit line and word line. In the illustrated example, the transistors 34 are PMOS transistors and the symbol "/" preceding "WL[0]" and "WL[1]" signifies that the transistors 34 may be controlled by the word line complement, for example, changing from a high (logic) level voltage (for example, VDD) to a low (logic) level voltage (for example, VSS which in the following may be considered as a zero voltage 0 V). A high level voltage of VDD accordingly also represents an advantageous choice for the reference voltage $V_H$. More generally however, the word line voltage may during the rest state be any voltage acting as a transistor-off voltage for the transistor 34 (which may be PMOS or NMOS transistors), wherein the reference voltage $V_H$ may be correspondingly adapted. The electrode of each MTJ device 10, 20 connected to the bit line (for example, the top electrode) will hence be brought to $V_H$. The other electrode (for example, the bottom electrode) will be disconnected from the voltage source of the memory cell 32 supplying the reference voltage $V_H$. The other electrode will hence track the bit line voltage through the MTJ device 10, 20.

In a second step, word lines connected to memory cells 32 to which data is to be written (that is, "selected word lines") may be brought to 0 V, for example WL[1] in FIG. 12A. The 0 V voltage on the selected word line(s) acts as a transistor-on voltage for the transistor 34 wherein the bottom electrode of the MTJ device 10, 20 of each memory cell 32 connected to the selected word line(s) will be supplied with and fixed to the reference voltage VH.

In a third step, while maintaining the transistor-on voltage, a reset voltage pulse may be applied across the MTJ device 10, 20 of each memory cell 32 which is to store the first binary value (for example, "first selected memory cells" such as memory cell 32b). As shown in FIG. 12A, the reset voltage pulse may be applied by changing a voltage on each bit line connected to a first selected memory cell (that is, "first selected bit lines" such as BL[1]) from $V_H$ to $V_H$-$V_{reset}$ and then back to $V_H$. The voltage pulse on the first selected bit line(s) will hence bring the top electrode of the MTJ device 10, 20 of the first selected memory cell(s) (for example, memory cell 32b) to $V_H$-$V_{reset}$. With the bottom electrode fixed to the reference voltage $V_H$ (for example, VDD) a voltage of a magnitude $V_{reset}$ is applied across the MTJ device 10, 20 of each first selected memory cell 32 (for example, memory cell 32b).

In a fourth step, which may be performed in parallel to the third step or prior to or subsequent to the third step, while maintaining the transistor-on voltage on the selected word line(s), a sequence of a reset voltage pulse and a set voltage pulse may be applied across the MTJ device 10, 20 of each memory cell 32 which is to store the second binary value (that is, "second selected memory cells" such as memory cell 32a). The reset voltage pulse may be applied in a similar manner as described above. The set voltage pulse may be applied by changing a voltage on each bit line connected to a second selected memory cell (that is, "second selected bit lines" such as BL[0]), from $V_H$ to $V_H$-$V_{set}$ and then back to $V_H$. The second selected bit line(s) will hence bring the top electrode of the MTJ device 10, 20 of the second selected memory cell(s) (for example, memory cell 32a) to $V_H$-$V_{set}$. With the bottom electrode fixed to the reference voltage $V_H$=VDD a voltage of a magnitude $V_{set}$ is applied across the MTJ device 10, 20 of each first selected memory cell 32 (for example, memory cell 32b).

In non-selected memory cells 32 (for example, memory cell 32c and 32d), the bottom electrode voltage may substantially follow the top electrode voltage and hence no switching of the MTJ device 10, 20 of non-selected memory cells will occur. For sake of completeness, it may be noted that the bottom electrode voltage may slightly lag the top electrode voltage by the RC time constant of the memory cell. By way of example, a resistance R<100 kΩ and a capacitance C<0.1 fF (which represent typical values for memory applications) would yield a time constant of about 10 ps. Hence, the disturbance on non-selected memory cells may be limited.

FIG. 12A represents an example where both timing and amplitude of the reset and set voltage pulse are controlled via the bit lines. That is, the voltages supplied to a first (top) electrode of an MTJ device 10, 20 during the reset voltage pulse and the set voltage pulse are different ($V_H$-$V_{reset}$ and $V_H$-$V_{set}$, respectively), and the (first) reference voltage and the (second) reference voltage supplied to the second (bottom) electrode of the MTJ device 10, 20 during third and fourth voltage pulses, respectively, are equal, that is, $V_H$=VDD.

Figure 15:
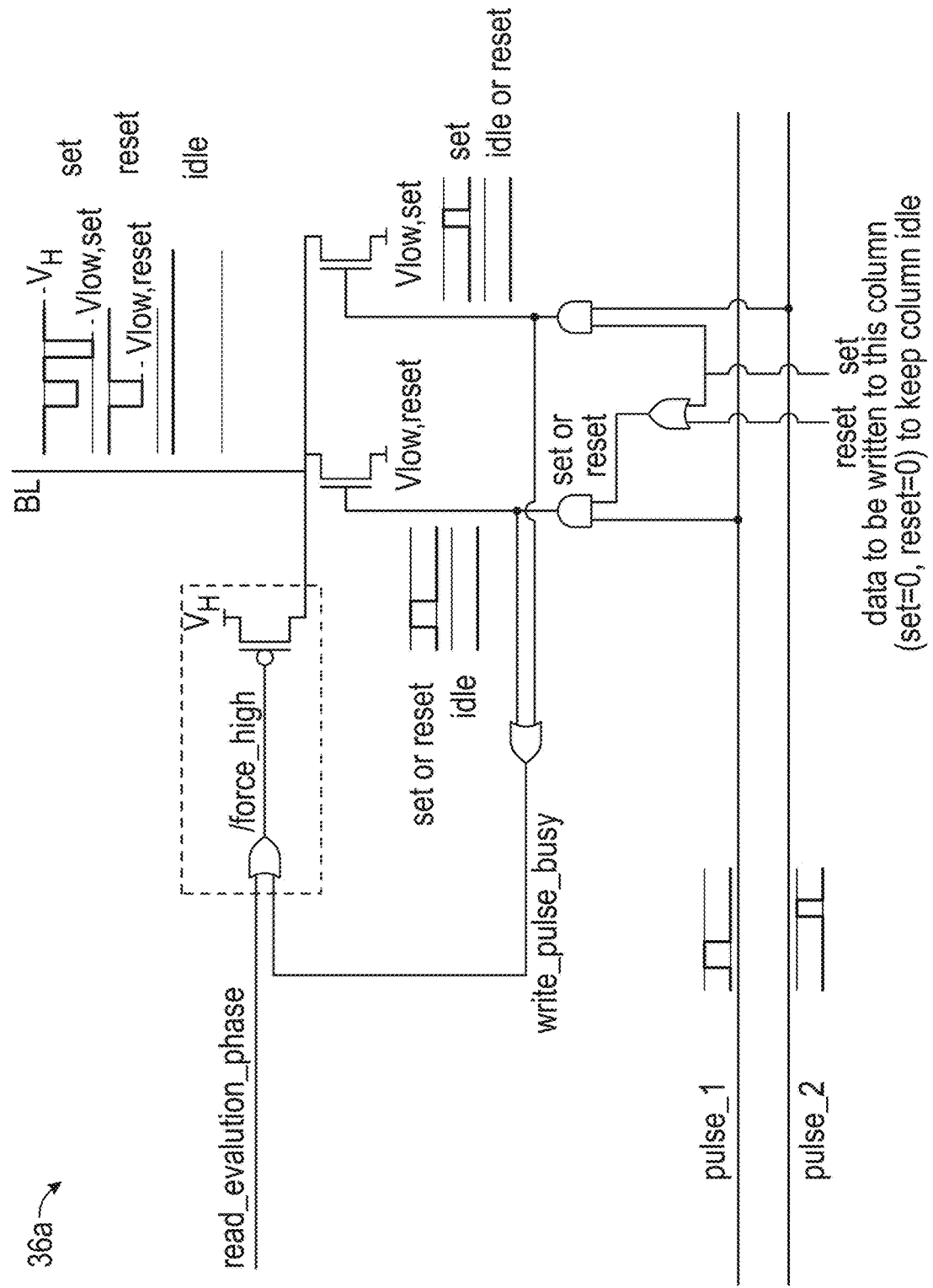
FIG. 15 shows an example configuration for a driver circuit.

FIG. 15 shows an example circuit portion 36a which may form part of the driver circuit 36 which is configured to generate the voltages supplied to the bit lines. The bit line BL may be driven high except while the reset and set voltage pulses are applied (as indicated by "write_pulse_busy"), and also during reading (as indicated by "read_evaluation-_phase"). The driver circuit 36 may include switching circuitry for routing the voltage pulses to selected bit lines.

Figure 16:
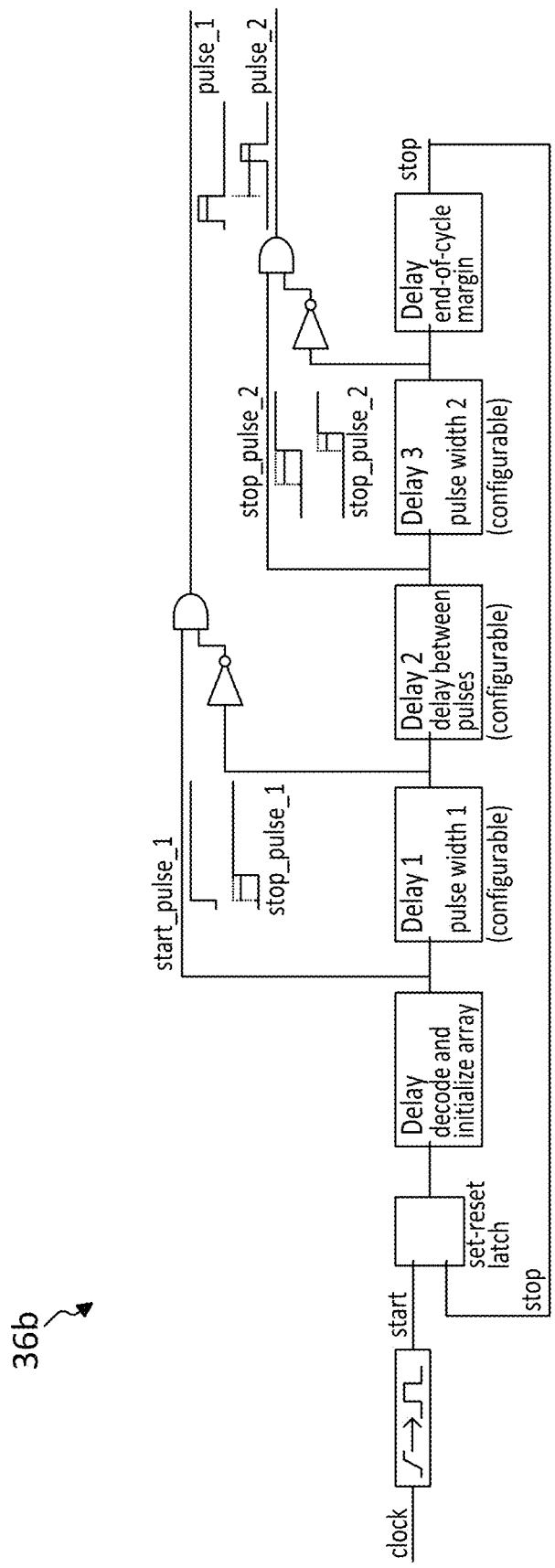
FIG. 16 shows an example configuration for a driver circuit.

FIG. 16 shows an example circuitry portion 36b which also may form part of the driver circuit 36 which is configured to generate the pulses denoted "pulse_1" and "pulse_2" input to the example circuit of FIG. 15. The clock signal may for example be generated by a suitable voltage-controlled oscillator. The configurable delays of delay blocks "Delay 1", "Delay 2", "Delay 3" may be implemented using conventional delay circuits, such as by a tapped delay line. The circuitry 36b may derive the pulses pulse_1 and pulse_2 from one clock edge. Alternatively, two clock edges may be used, one for pulse_1 and one for pulse_2.

It should be noted that the circuitries of FIGS. 15 and 16 merely represent two examples, and that more generally any circuitry capable of generating voltage pulses of appropriate voltages and duration may be used.

Figure 12B:
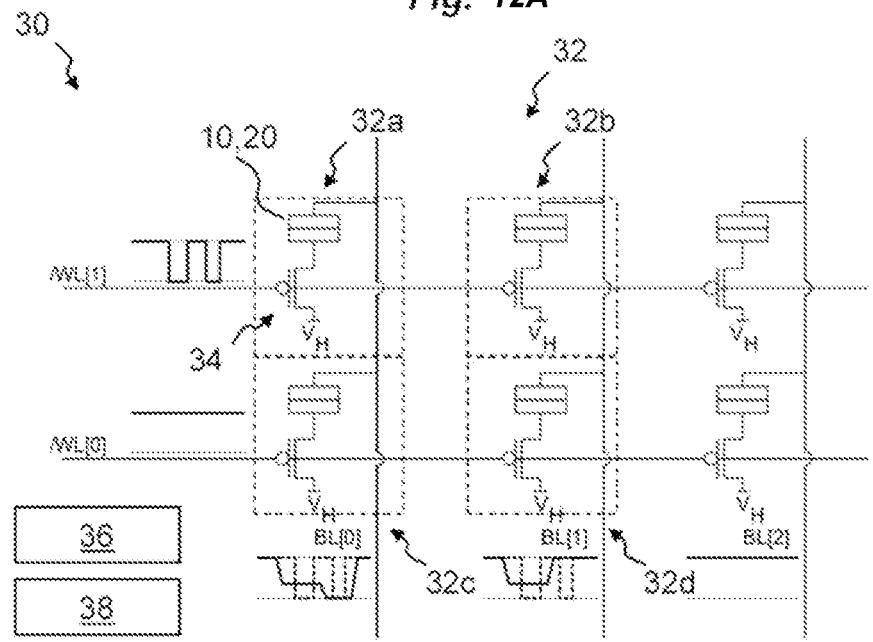

FIG. 12B illustrates a magneto-resistive memory device 30 that is similar to the memory device 30 of FIG. 12A, however is also different in that the timing and duration of the reset and set voltage pulse is controlled via the word line and an amplitude of the reset and set voltage pulse is controlled via the bit line. More specifically, a timing and a duration of the reset voltage pulse is controlled via the word line and an amplitude of the reset voltage pulse is controlled via the bit line. Correspondingly, a timing and a duration of the set voltage pulse is controlled via the word line and an amplitude of the set voltage pulse is controlled via the bit line.

As shown in FIG. 12B, the timing and duration of the reset and set voltage pulses are controlled on the selected word line by a first and second pulse of equal amplitude (for example, changing from VDD to VSS and back to VDD). The pulses may, for example, be generated using circuitry similar to the circuitries 36a, 36b, however modified to generate the pulses with a same amplitude and supplying the same to the selected word lines. The bottom electrode of the MTJ device 10, 20 of each selected memory cell will hence be supplied with the reference voltage $V_H$ (for example, VDD) when the transistor 34 is switched on.

While the first pulse is active on the selected word line, the first selected bit line (such as BL[1] connected to first selected memory cell 32b) may be supplied with a first reference level voltage $V_{L1}$ such that a reset voltage pulse with amplitude $V_{L1}$-$V_H$=-$V_{reset}$ is applied across the MTJ device 10, 20 of the first selected memory cell 32b. The voltage on the first selected bit line may subsequently be returned to $V_H$ such that, while the second pulse is active on the selected word line, a voltage across the MTJ device remains at 0 V.

On the second selected bit line (such as BL[0]) connected to second selected memory cell 32a) the voltage may be controlled in a similar manner as on the first selected bit line by supplying the first reference level voltage $V_{L1}$ such that a reset voltage pulse with amplitude $V_{L1}$-$V_H$=-$V_{reset}$ is applied across the MTJ device 10, 20 of the second selected memory cell 32a. However, while the second pulse is active on the selected word line, the second selected bit line may be supplied with a second reference level voltage $V_{L2}$ such that a set voltage pulse with amplitude $V_{L2}$-$V_H$=-$V_{set}$ is applied across the MTJ device 10, 20 of the second selected memory cell 32a.

Figure 13A:
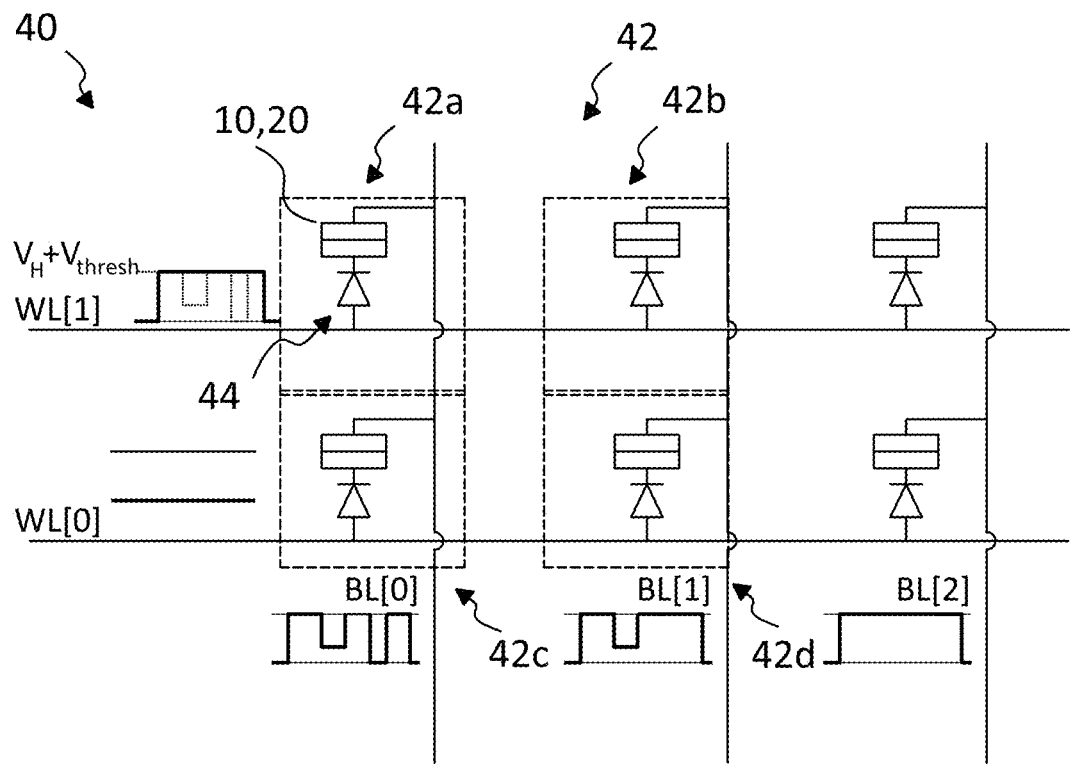
FIGS. 13A-13B schematically illustrate variations of a memory device with 1S1MTJ memory cells.
Figure 13B:
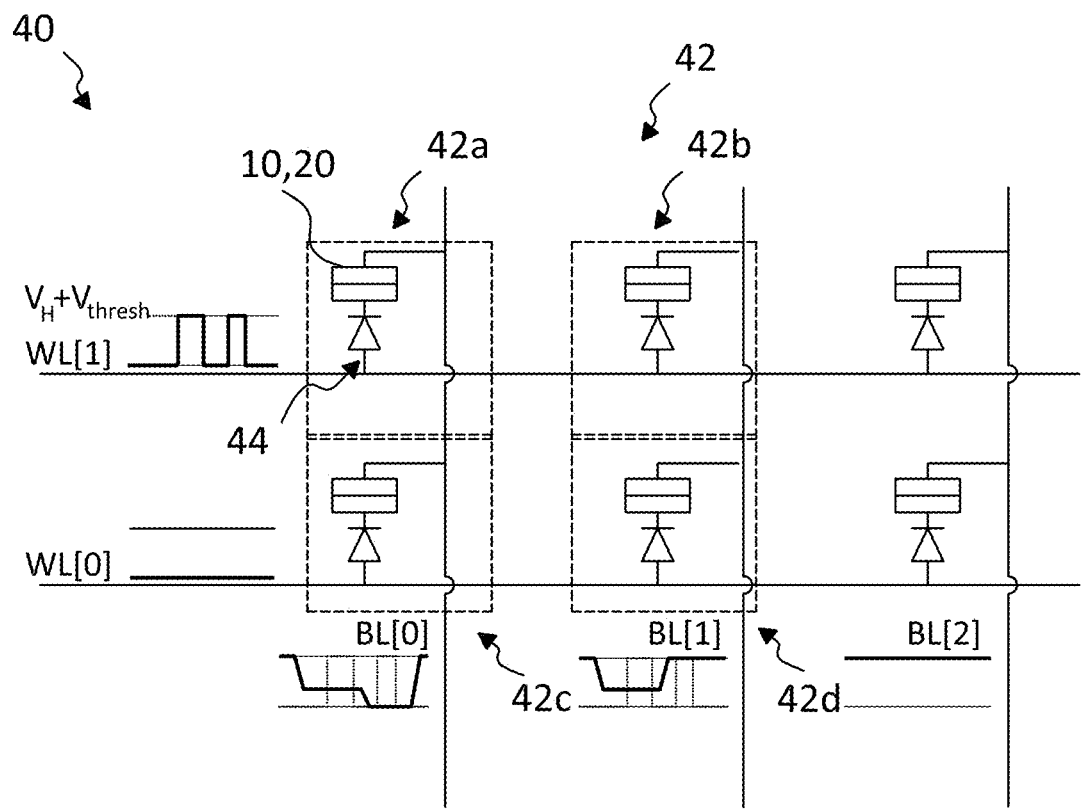

FIGS. 13A and 13B illustrate magneto-resistive memory devices 40 that are similar to the memory devices 30 of FIGS. 12A and 12B, however are also different in that the memory cells 42 includes a two-terminal selector device 44 instead of a transistor. The memory cells 42 are hence formed as 1S1MTJ memory cells. In FIG. 13A, the timing, the duration, and the amplitudes of the reset and set voltage pulses are controlled via the bit line. In FIG. 13B, the timing and duration of the reset and set voltage pulses are controlled via the word line and an amplitude of the reset and set voltage pulses are controlled via the bit line. Examples of selector devices include a diode selectors, ovonic threshold switch (OTS), silicon-based selectors, metal-insulator-metal based selectors, metal-insulator transition (MIT) selectors, field assisted super-linear threshold (FAST) selectors, mixed ionic-electron conduction (MIEC) selectors and 2D material based selectors (for example, graphene or transition metal dichalcogenides such as $MoS_2$).

In the example of FIG. 13A, the word lines and bit lines may during a rest state be set to VSS, for example, 0 V. To initiate writing, the bit lines may be set to a reference level voltage $V_H$, which may be a positive polarity voltage of a level providing a sufficient headroom to allow reset and set voltage pulses to be applied as will be described below. Optionally, the bit line voltage may be set to $V_H+V_{thresh}$, the second term representing the threshold voltage of the selector. In either case, the bit line voltage will result in the selectors 44 being reverse-biased.

The word line voltages may thereafter be increased to $V_H+V_{thresh}$. A reset pulse may then be applied across the MTJ devices of the selected memory cells (for example, memory cells 42b) by supplying a negative polarity voltage pulse (for example, corresponding to the third voltage pulse) on the first selected bit lines (for example, BL[1]), subtracting from the bit line reference level voltage $V_H$ or $V_H+V_{thresh}$. The amplitude of the voltage pulse applied to the bit lines should be such that a reset voltage pulse (that is, of magnitude $V_{reset}$) results across the MTJ devices 10, 20 of the first selected memory cells. Due to the voltage drop over the selector 44, the difference between the word line and bit line voltage must be at least $V_{reset}+V_{thresh}$. On the second selected bit line (such as BL[0]) connected to second selected memory cell 42a) the voltage may be controlled in a similar manner as on the first selected bit line in order to apply a reset voltage pulse across the MTJ device 10, 20 of the memory cell 42a. Subsequently, a set voltage pulse may be applied across the MTJ device 10, 20. A negative polarity voltage pulse (for example, corresponding to the fourth voltage pulse) may be supplied to the second selected bit lines (for example, BL[0]), subtracting from the bit line reference level voltage $V_H$ or $V_H+V_{thresh}$. The amplitude of the voltage pulse applied to the bit lines should be such that a set voltage pulse (that is, of magnitude $V_{set}$) results across the MTJ devices 10, 20 of the second selected memory cells. Due to the voltage drop over the selector 44, the difference between the word line and bit line voltage must be at least $V_{set}+V_{thresh}$. Subsequent to applying the reset and set voltage pulses, the word lines and bit lines may be brought to a low level voltage, for example, 0 V. The voltage pulses applied to the bit lines may be generated using circuitry similar to FIGS. 15 and 16.

The operation of the example shown in FIG. 13B is similar to the example of FIG. 13A, however it also differs in that a first and a second pulse (controlling a timing and a duration of the reset and set voltage pulses) are applied on the selected word line, while an amplitude is controlled by varying a voltage appropriately on the first and second selected bit lines.

Figure 14A:
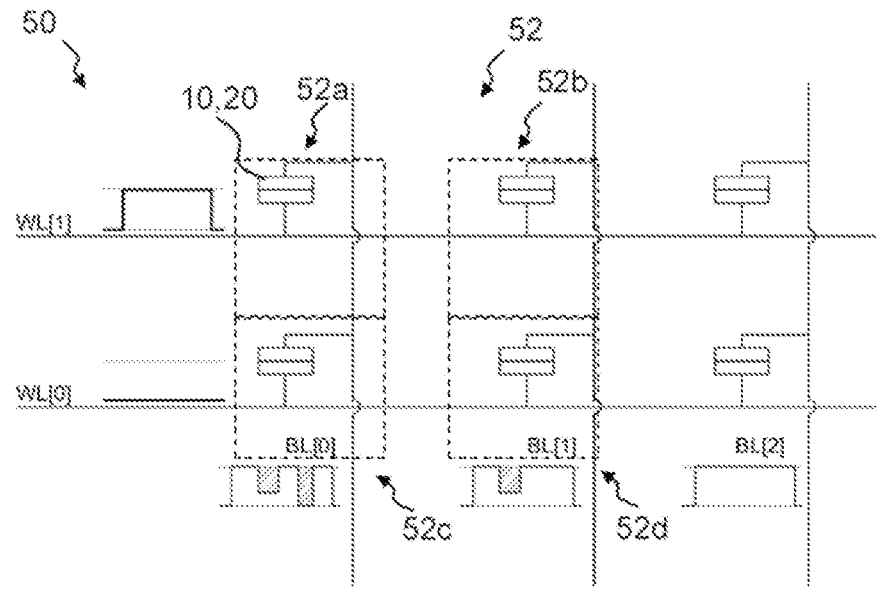
FIGS. 14A-14B schematically illustrate variations of a memory device with 0T1MTJ memory cells.
Figure 14B:
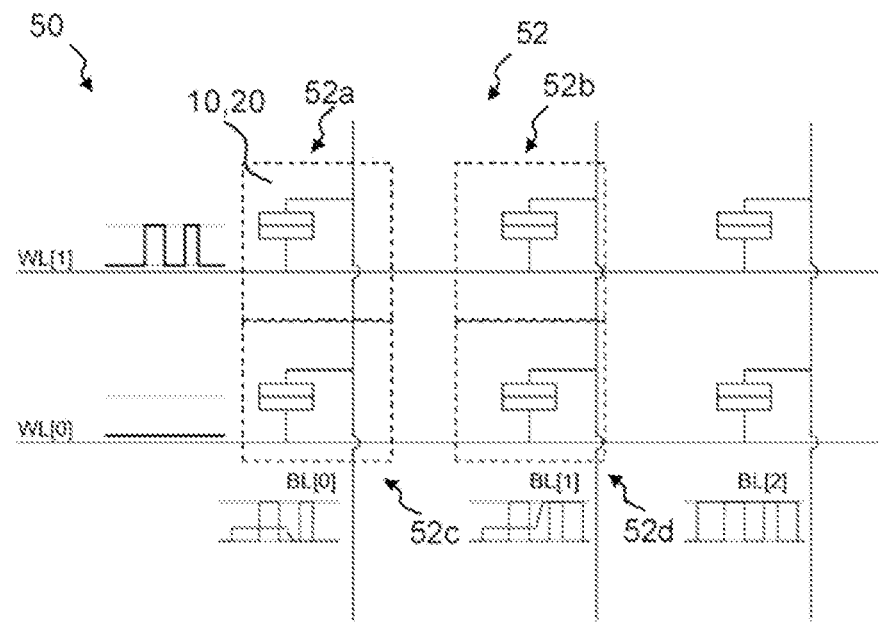

FIGS. 14A and 14B illustrate magneto-resistive memory devices 50 that are similar to the memory devices 30 and 40 of FIGS. 12A-12B and 13A-13B, however they are also different in that the memory cells 52 are formed as 0S1MTJ memory cells. In FIG. 14A, the timing, the duration, and the amplitudes of the reset and set voltage pulse are controlled via the bit line. In FIG. 14B, the timing and duration of the first and second voltage pulse is controlled via the word line and an amplitude of the first and second voltage pulse is controlled via the bit line. As mentioned above, a 0S1MTJ configuration may be advantageously applied to perform matrix-vector multiplication for the purpose of AiMC. This is an application where no regular selective memory cell read-out is needed, and the need for selector transistors and other selector devices is obviated. As may be seen in FIGS. 14A and 14B, write operation is similar as in the 1S1MTJ memory arrays of FIGS. 13A and 13B, but due to the absence of a selector, there is no selector threshold voltage $V_{thresh}$ to take into account.

In FIG. 14A, negative polarity pulse(s) are applied to the selected bit lines BL[0], BL[1], subtracting from the bit line reference level voltage $V_H$, while a positive polarity reference voltage (for example, $V_H$) is applied on the selected word line WL[1] such that voltage pulses of magnitude $V_{reset}$ and $V_{set}$ may be applied across the MTJ device 10, 20 of the first and second selected memory cells 52a, 52b, as appropriate. Word line and bit line voltages may during rest state (before and after writing operation) be set to 0 V. As shown in FIG. 14A, as writing is initiated, all bit lines may be brought to $V_H$. Since the non-selected word lines are maintained at 0 V, a current may flow through memory cells along non-selected word lines (for example, memory cells 52c, 52d along WL[0]). For AiMC applications the memory cell resistance is however typically very high, for example >1 MΩ, thus effectively limiting the current flow through non-selected memory cells.

In FIG. 14B, different reference level voltages (for example, positive polarity voltages) are supplied on the selected bit lines (for example, BL[0] and BL[1]) in order to apply a reset voltage pulse with magnitude $V_{reset}$ across the MTJ device 10, 20 of the first selected memory cells (for example, memory cell 52b) and a sequence of a reset voltage pulse with magnitude $V_{reset}$ and a set voltage pulse with magnitude $V_{set}$ across the MTJ device 10, 20 of the second selected memory cells (for example, memory cell 52a).

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims.

What is claimed is:

1. A method of operating a memory array comprising a plurality of memory cells each comprising a voltage-controlled magnetic anisotropy (VCMA) magnetic tunnel junction (MTJ) device, the method comprising:
    providing the memory array comprising the VCMA MTJ devices, each MTJ device switchable between a first resistance state and a second resistance state, each MTJ device configured to switch from the second resistance state to the first resistance state at a first threshold voltage that is lower than a second threshold voltage for switching each MTJ device from the first resistance state to the second resistance state,
    selecting a subgroup of MTJ devices to be written into predetermined final states, the subgroup including a first subgroup to be written into the first resistance state and a second subgroup to be written into the second resistance state, and
    writing the selected subgroup of MTJ devices to the predetermined final states, writing comprising:
        without pre-reading to determine initial resistance states of the selected subgroup of MTJ devices, applying a first voltage pulse to each of the selected subgroup of MTJ devices, the first voltage pulse having an amplitude having an absolute value that is effective to switch any MTJ device in the selected subgroup of MTJ devices in the second resistance state, if present, to the first resistance state while being ineffective to switch any MTJ device in the selected subgroup of MTJ devices in the first resistance state, if present, to the second resistance state such that the resistance state of any MTJ device in the first resistance state remains unchanged, and such that each of the selected subgroup of MTJ devices is caused to be in the first resistance state, and subsequent to causing each of the selected subgroup of MTJ devices to be in the first resistance state, applying a second voltage pulse with an amplitude having an absolute value equal to or greater than the second threshold voltage to each of the second subgroup of MTJ devices, thereby setting each of the second subgroup of MTJ devices to the second resistance state as the final resistance state, while leaving each of the first subgroup of MTJ devices in the first resistance state as the final resistance state.

2. The method according to claim 1, wherein:

applying the first voltage pulse to a MTJ device of the VCMA MTJ devices comprises, while supplying a voltage of a first reference level to a first electrode of the MTJ device, supplying a third voltage pulse to a second electrode of the MTJ device; and applying the second voltage pulse to the MTJ device comprises, while supplying a voltage of a second reference level to the first electrode of the MTJ device, supplying a fourth voltage pulse to the second electrode of the MTJ device.

3. The method according to claim 2, wherein an amplitude of the third voltage pulse is equal to an amplitude of the fourth voltage pulse, and wherein the first reference level differs from the second reference level.

4. The method according to claim 3, wherein:

the first reference level and the amplitude of the third voltage pulse is such that an absolute value of a difference thereof is equal to or exceeds the first threshold voltage and is less than the second threshold voltage, and the second reference level and the amplitude of the fourth voltage pulse is such that an absolute value of a difference thereof is equal to or exceeds the second threshold voltage.

5. The method according to claim 1, wherein a duration of the first voltage pulse is greater than a duration of the second voltage pulse.

6. The method according to claim 1, wherein a probability of switching a MTJ device of the VCMA MTJ devices from the first resistance state to the second resistance state oscillates as a function of a duration of the second voltage pulse, and wherein a duration of the second voltage pulse is less than a period of the oscillatory function.

7. The method according to claim 1, wherein the method further comprises:

applying the first voltage pulse to each one of a first subset of the VCMA MTJ devices, thereby setting each one of the first subset of the VCMA MTJ devices to a respective first resistance state regardless of a respective initial resistance state of the first subset of the VCMA MTJ devices; and applying the first voltage pulse and then the second voltage pulse to each one of a second subset of the VCMA MTJ devices, thereby setting each one of the second subset of the VCMA MTJ devices to a respective second resistance state regardless of a respective initial resistance state of the second subset of the VCMA MTJ devices.

8. The method according to claim 1, further comprising generating a magnetic stray field by a MTJ device of the VCMA MTJ devices during the application of the first voltage pulse and the second voltage pulse.

9. The method according to claim 1, wherein the absolute value of the amplitude of the first voltage pulse is equal to or greater than the first threshold voltage and lower than the second threshold voltage.

10. A magneto-resistive memory device comprising:

a memory array comprising:

a plurality of memory cells each comprising a voltage-controlled magnetic anisotropy (VCMA) magnetic tunnel junction (MTJ) device, each MTJ device configured to be switchable between a first resistance state and a second resistance state, wherein a first threshold voltage for switching each MTJ device from the second resistance state to the first resistance state is lower than a second threshold voltage for switching each MTJ device from the first resistance state to the second resistance state; and a driver circuit configured to:

select a subgroup of MTJ devices to be written into predetermined final states, the subgroup including a first subgroup to be written into the first resistance state and a second subgroup to be written into the second resistance state, and write the selected subgroup of MTJ devices to the predetermined final states, writing comprising:

without pre-reading to determine initial resistance states of the selected subgroup of MTJ devices, applying a first voltage pulse to each of the selected subgroup of MTJ devices with an amplitude having an absolute value that is effective to switch any MTJ device of the selected subgroup of MTJ devices in the second resistance state, if present, to the first resistance state while being ineffective to switch any MTJ device of the selected subgroup of MTJ devices in the first resistance state, if present, to the second resistance state such that the resistance state of any MTJ device in the first resistance state remains unchanged, and such that each of the selected subgroup of MTJ devices is caused to be in the first resistance state, and subsequent to causing each of the selected subgroup of MTJ devices to be in the first resistance state, applying a second voltage pulse with an amplitude having an absolute value equal to or greater than the second threshold voltage to each of the second subgroup of MTJ devices, thereby setting each of the second subgroup of MTJ devices to the second resistance state as the final resistance state, while leaving each of the first subgroup of MTJ devices in the first resistance state as the final resistance state.

11. The memory device according to claim 10, wherein the driver circuit is configured to:

apply the first voltage pulse to each one of a first subset of the VCMA MTJ devices, and apply the first voltage pulse and then the second voltage pulse across to each one of a second subset of the VCMA MTJ devices.

12. The memory device according to claim 11, further comprising:

a plurality of bit lines and a plurality of word lines, wherein each memory cell of the plurality of memory cells comprises a transistor having a first terminal, a second terminal connected to a voltage source, and a gate terminal connected to one of the word lines, and wherein the MTJ device of each memory cell is connected between one of the bit lines and the first terminal of the transistor of the memory cell.

13. The memory device according to claim 12, wherein the driver circuit is configured to:
   in applying the first voltage pulse to the MTJ device of any one of the memory cells, control a timing and a duration of the first voltage pulse via the word line and an amplitude of the first voltage pulse via the bit line, and
   in applying the second voltage pulse to the MTJ device of any one of the memory cells, control a timing and a duration of the second voltage pulse via the word line and an amplitude of the second voltage pulse via the bit line.

14. The memory device according to claim 11, further comprising:
   a plurality of bit lines and a plurality of word lines,
   wherein the MTJ device of each memory cell comprises a first terminal connected to one of the bit lines and a second terminal connected to one of the word lines, and wherein the second terminal is directly connected to the word line or the second terminal is connected to the word line via a selector of the memory cell.

15. The memory device according to claim 14, wherein the driver circuit is configured to:
   in applying the first voltage pulse to the MTJ device of any one of the memory cells, control a timing and a duration of the first voltage pulse via the word line and an amplitude of the first voltage pulse via the bit line, or vice versa; and
   in applying the second voltage pulse to the MTJ device of any one of the memory cells, control a timing and a duration of the second voltage pulse via the word line and an amplitude of the second voltage pulse via the bit line, or vice versa.

16. The memory device according to claim 14, wherein the second terminal is connected to the word line via the selector of the memory cell, and wherein the selector is a diode selector, ovonic threshold switch (OTS), silicon-based selector, metal-insulator-metal based selector, metal-insulator transition (MIT) selector, field assisted super-linear threshold (FAST) selector, mixed ionic-electron conduction (MIEC) selector, or 2D material based selector.

17. The memory device according to claim 14, wherein the second terminal is directly connected to the word line, and wherein the MTJ device is configured to perform matrix-vector multiplication for analog in-memory computing (AiMC).

18. The memory device according to claim 10, wherein:
   applying the first voltage pulse to a MTJ device of the VCMA MTJ devices using the driver circuit comprises supplying, using the driver circuit, a third voltage pulse to a second electrode of the MTJ device while supplying a voltage of a first reference level to a first electrode of the MTJ device; and
   applying the second voltage pulse to the MTJ device using the driver circuit comprises supplying, using the driver circuit, a fourth voltage pulse to the second electrode of the MTJ device while supplying a voltage of a second reference level to the first electrode of the MTJ device.

19. The memory device according to claim 18, wherein an amplitude of the third voltage pulse is equal to an amplitude of the fourth voltage pulse, and the first reference level differs from the second reference level.

20. The memory device according to claim 10, wherein a duration of the first voltage pulse is greater than a duration of the second voltage pulse.

21. The memory device according to claim 10, wherein a probability of switching a MTJ device of the VCMA MTJ devices from the first resistance state to the second resistance state oscillates as a function of a duration of the second voltage pulse, and wherein a duration of the second voltage pulse is less than a period of the oscillatory function.

22. The memory device according to claim 10, wherein a MTJ device of the VCMA MTJ devices is further configured to generate a magnetic stray field.

23. The memory device according to claim 10, wherein the absolute value of the amplitude of the first voltage pulse is equal to or greater than the first threshold voltage and lower than the second threshold voltage.

* * * * *

UNITED STATES PATENT AND TRADEMARK OFFICE
CERTIFICATE OF CORRECTION

PATENT NO. : 12,347,475 B2  
APPLICATION NO. : 17/344796  
DATED : July 1, 2025  
INVENTOR(S) : Woojin Kim et al.

Page 1 of 1

It is certified that error appears in the above-identified patent and that said Letters Patent is hereby corrected as shown below:

On the Title Page

Column 1, Line 2, under Assignees, delete "Leuven, Leuyen (BE)" and insert --Leuven, Leuven (BE)--.

In the Specification

In Column 2, Line 8, delete "to FIRS in" and insert --to HRS in--.

In the Claims

In Column 20, Claim 11, Line 59, delete "pulse across to" and insert --pulse to--.

Signed and Sealed this  
Sixteenth Day of September, 2025

Coke Morgan Stewart  
*Acting Director of the United States Patent and Trademark Office*